United States Patent [19]

Schwalm et al.

[11] Patent Number: 4,808,682

[45] Date of Patent: Feb. 28, 1989

[54] COPOLYMERS HAVING O-NITROCARBINOL ESTER GROUPS, PRODUCTION OF TWO-LAYER RESISTS, AND FABRICATION OF SEMICONDUCTOR COMPONENTS

[75] Inventors: Reinhold Schwalm, Wachenheim; Horst Binder, Lampertheim, both of Fed. Rep. of Germany

[73] Assignee: BASF Aktiengesellschaft, Fed. Rep. of Germany

[21] Appl. No.: 142,913

[22] Filed: Jan. 12, 1988

[30] Foreign Application Priority Data

Jan. 24, 1987 [DE] Fed. Rep. of Germany ....... 3702035

[51] Int. Cl.$^4$ ........................... C08F 20/36; G03C 1/70
[52] U.S. Cl. ..................................... 526/279; 526/311; 430/270; 430/281; 430/285; 430/286; 430/311; 430/313; 430/314; 156/643
[58] Field of Search ............... 430/270, 281, 285, 286, 430/311, 313, 314; 526/311, 279; 156/643

[56] References Cited

U.S. PATENT DOCUMENTS

| | | | |
|---|---|---|---|
| 3,926,636 | 12/1975 | Barzynski et al. ................. | 430/280 |
| 4,075,175 | 2/1978 | Foss ...................... | 522/111 |
| 4,456,679 | 6/1984 | Leyrer et al. ..................... | 430/280 |
| 4,481,049 | 11/1984 | Reichmanis et al. . | |
| 4,521,274 | 6/1985 | Reichmanis et al. . | |
| 4,596,759 | 6/1986 | Schupp et al. ................... | 430/313 |

FOREIGN PATENT DOCUMENTS 3215843 11/1982 · Fed. Rep. of Germany ...... 526/279

0098184 6/1984 Japan ................... 526/279

OTHER PUBLICATIONS

H. Gokan, SPIE—International Society for Optical Engineering, vol. 539, Advances in Resist Technology & Processing II, pp. 62–68, (1985).
J. Shaw, Polymer Engineering and Science, vol. 23, pp. 1054–1058, 1983.
D. Hofer, Polysilane Bilayer uv Lithography, SPIE, vol. 469, pp. 16–23, 1984.
S. A. MacDonald, Microelectronic Engineering 1, pp. 269–293, 1983.
M. Suzuki, Journal of the Electrochemical Society, vol. 130, pp. 1962–1964, 1983.
F. Buiguez, Microcircuit Engineering 1984, A. Heuberger, H. Beneking, Eds., Academic Press, 1985, pp. 471–481.
Introduction to Microlithography, American Chemical Society, 1983, pp. 288–350—Chapter 6.

*Primary Examiner*—Paul R. Michl
*Assistant Examiner*—Susan E. Shaw McBee
*Attorney, Agent, or Firm*—Keil & Weinkauf

[57] ABSTRACT

Copolymers useful in particular for producing two-layer resists and fabricating semiconductor devices contain from 5 to 50 mol % of monomers having o-nitrocarbinol ester groups, from 95 to 50 mol % of an olefinically unsaturated silicon-containing organic compound, from 0 to 20 mol % of an olefinically unsaturated carboxylic acid and from 0 to 25 mol % of other copolymerizable monomers.

16 Claims, No Drawings

COPOLYMERS HAVING O-NITROCARBINOL ESTER GROUPS, PRODUCTION OF TWO-LAYER RESISTS, AND FABRICATION OF SEMICONDUCTOR COMPONENTS

The present invention relates to a copolymer having o-nitrocarbinol ester groups which, after exposure, is alkali-stripable and resistant in oxygen plasma, and to processes for producing a two-layer resist and fabricating a semiconductor device.

To fabricate semiconductor devices, multilayer resists, in particular three-layer resists, are used, in particular for producing resist structures <2 μm in dimension on substrates of variable topography. These resists have on the substrate a polymer basecoat, the chief purpose of which is to planarize the surface of the substrate. The thickness of the planarizing layer varies with the height of the steps on the substrate and can be up to 4 μm. The layer need not be inherently light-sensitive, but should be completely strippable in the course of specific plasma treatment, for example in oxygen plasma. There then follows an intermediate layer selected for the fact that its rate of etching in specific plasma treatment, for example in oxygen plasma, is substantially less than that of the planarizing layer underneath. The top layer comprises a light-sensitive material, for example a commercial diazoquinone-novolak photoresist which can be subjected to imagewise exposure and development. The three-layer resist is then structured by subjecting the uppermost layer to exposure and development using conventional lithographic techniques to produce relief structures. The pattern produced is then transferred by means of a suitable plasma, for example a fluorohydrocarbon-containing plasma, into the intermediate layer. The pattern thus produced in the intermediate layer then serves as a mask for further structure transfer into the planarizing layer, for example by means of an oxygen plasma. The advantages of this three-layer technique are, first, that it is possible to employ a relatively thick planarizing layer without losing resolution and, secondly, that the upper light-sensitive layer can be very thin (~0 1 μm to 1 μm), their resolution improving with decreasing layer thickness. The disadvantage, however, is the large number of process steps required for building up and structuring a three-layer resist.

To reduce the number of process steps, the prior art reveals a number of proposals for materials which combine the properties of the top two layers, ie. the light sensitivity and plasma resistance, in one layer. Materials of this type contain for example organosilicon, organotin or organotitanium groups in the molecule.

The silicon-containing resists for two-layer systems has been reviewed for example by H. Gokan in SPIE-International Society for Optical Engineering, vol. 539, Advances in Resist Technology and Processing II, pp. 62–68 (1985). Existing proposals for use as both light-sensitive and plasma-resistant polymers further include for example polysiloxanes (I. Shaw, Polym. Eng. Sci. 23 (1983), 1054), polysilanes (D. Hofer, SPIE vol. 469 (1984), 16–23 pp.), trimethylsilylstyrene copolymers (S. A. McDonald, Microelectronic Eng. 1 (1983), pp. 269–293) and M. Suzuki, I. Electrochem. Soc. 130 (1983), pp. 1962–64). Most of the organosilicon-containing polymers are negative-working resists, since alkylsilicon or vinylsilicon groups tend to crosslink on exposure. However, positive-working resists having organosilicon groups are also known, e.g. polysilanes, silylated polystyrenes (Buiguez, Microcircuit Engineering 1984, A. Heuberger, H. Beneking, Eds., Academic Press 1985 pp. 471–481), silicon-containing oxime esters of methacrylic acid (U.S. Pat. No. 4,433,044), silylated novolaks (U.S. Pat. No. 4,521,274) and silicon derivatives of poly-(methyl methacrylate) (U.S. Pat. No. 4,481,049). The polymers mentioned all show resistance in oxygen plasma if a certain minimum number of silicon atoms is present in the molecule. However, each system has its own specific disadvantages in respect of light sensitivity, developability or thermal stability. For example, the trimethylsilylstyrene copolymers and the silylated polymethyl methacrylate (=PMMA) derivatives are developable only with organic solvents. It is true that the silylated novolak resists are strippable with alkaline solvents, but they are not suitable for exposure in deep UV ($\lambda = 190-300$ nm).

Light-sensitive alkali-strippable polymers containing o-nitrocarbinol ester groups in the molecule are known for example from DE-A-No. 2,242,394, DE-A-No. 2,150,691 and DE-A-No. 3,326,036. It is true that these polymers are structurable with deep UV light (for example $\lambda = 248$ nm), but they are completely degraded in oxygen plasma.

It is an object of the present invention to provide a polymer which is light-sensitive in the deep UV (DUV) region ($\lambda = 190-300$ nm), which is water- or alkali-strippable, and which shows resistance in oxygen plasma.

We have found that this object is achieved with a specific copolymer containing not only o-nitrocarbinol ester groups but also not less than 6% by weight of silicon. This polymer is particularly suitable for producing two-layer resist systems having the performance characteristics of three-layer resists used in the fabrication of semiconductor devices.

The present invention accordingly provides a copolymer containing as copolymerized units (a) from 5 to 50 mol % of one or more compounds of the general formula (I)

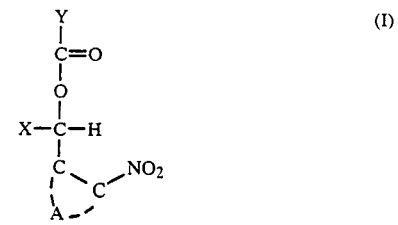

where A is an aromatic or hetaromatic, substituted or unsubstituted ring system of 5 to 14 ring members, X is hydrogen, alkyl of 1 to 8 carbon atoms or substituted or unsubstituted aryl or aralkyl, and Y is an ethylenically unsaturated radical of 2 to 6 carbon atoms, (b) from 95 to 50 mol % of one or more copolymerizable olefinically unsaturated silicon-containing organic compounds, (c) from 0 to 20 mol % of one or more copolymerizable olefinically unsaturated carboxylic acids of 3 to 6 carbon atoms, (d) from 0 to 25 mol % of one or more further olefinically unsaturated, copolymerizable organic compounds other than (a), (b) and (c), whose homopolymers are transparent within the wavelength region from 250 to 400 nm, with the proviso that the sum of the percentages mentioned under (a) to (d) is 100 and the copolymer has a silicon content of >6% by weight.

Y in the general formula (I) is preferably one of the radicals

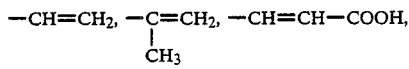

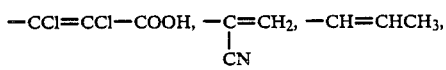

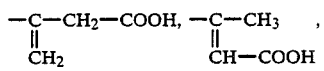

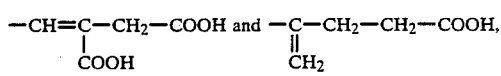

in particular the radical 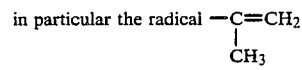

and A is phenyl.

The o-nitrocarbinol ester group of the formula (I) is preferably derived from o-nitrobenzyl alcohol, nitro-6chlorobenzyl alcohol, 2-nitro-4-cyanobenzyl alcohol, α-methyl-o-nitrobenzyl alcohol, α-phenyl-o-nitrobenzyl alcohol or α-(o-nitrophenyl)-o-nitrobenzyl alcohol as parent carbinol.

A copolymerizable olefinically unsaturated silicon-containing compound (b) is preferably a derivative of styrene or α-methylstyrene, in particular 4-trimethylsilylstyrene, or a derivative of acrylic acid or methacrylic acid, in particular trimethylsilyl methacrylate, trimethylsilylmethyl methacrylate, 3-methacryloyloxypropylbis(trimethylsiloxy)methylsilane, 3-methacryloyloxypropylpentamethyldisiloxane, 3-methacryloyloxypropyltris(trimethylsiloxy)silane, 3-methacryloyloxypropyltrimethoxysilane or 2-(trimethylsilyl)ethyl methacrylate, and a component (c) is preferably acrylic acid or methacrylic acid.

The present invention also provides a process for producing a two-layer resist where the lower layer comprises a polymer degradable in oxygen plasma, for example a conventional novolak resist, and the upper layer a copolymer according to the invention.

An advantageous embodiment of this process for producing a two-layer resist comprises first structuring the copolymer according to the invention and then transferring the pattern into the lower layer by means of a plasma, preferably an oxygen plasma.

The copolymer according to the invention can contain for example structural units of the general formula (II)

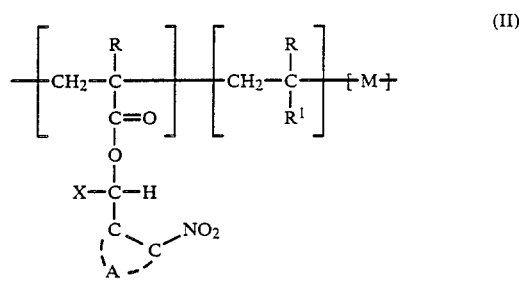

where X and A have the same meanings as in the formula (I), R is hydrogen or alkyl, preferably methyl, $R^1$ contains silicon atoms and can be a substituted aromatic radical or an ester group (-$COOR^2$), in which case $R^2$ then contains silicon, and facultatively M is the copolymerized radical of one or more further copolymerized olefinically unsaturated monomer components which, partly, may also contain carboxyl.

Using the polymer according to the invention it is possible to produce a two-layer resist having a planar surface. The copolymer according to the invention can be subjected to imagewise structuring with DUV light and washed out with water or an alkaline solvent. The pattern produced can then be transferred by means of an oxygen plasma into the lower planarizing layer. The resist structures making up the mask are stripped only to a small extent, if at all, by virtue of the silicon content.

In what follows, the individual components of the copolymer according to the invention are discussed in detail.

(a) Suitable compounds of the general formula (I)

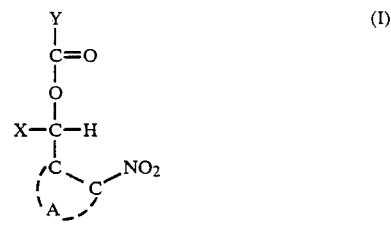

where A is a mono- or polynuclear aromatic or hetaromatic, substituted or unsubstituted ring system of 5 to 14 ring members, X is hydrogen, alkyl of 1 to 8 carbon atoms or substituted or unsubstituted aryl or aralkyl, and Y is an ethylenically unsaturated radical of 2 to 6 carbon atoms, are for example those where Y in the general formula (I) is one of the radicals

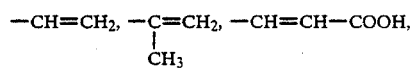

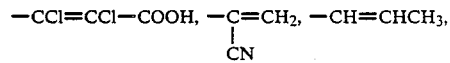

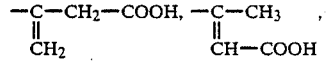

-continued

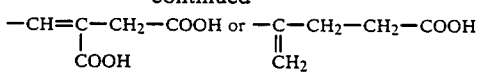

For the purposes of this invention, an aromatic ring system A is in particular benzene or a substituted benzene. The benzene ring may be substituted one or more times, for example by $C_1$–$C_8$-alkyl, in particular methyl, $C_1$–$C_6$-alkoxy, in particular methoxy, halogen, such as chlorine, nitro, amino, monoalkylamino, dialkylamino or sulfo. Also possible are correspondingly substituted and unsubstituted polynuclear benzene derivatives, such as naphthalene, anthracene, anthraquinone and phenanthrene. A hetaromatic ring system A is in particular pyridine or a derivative thereof.

The o-nitrocarbinol ester groups are particularly suitably derived for example from the following aromatic or hetaromatic o-nitrocarbinol parents: o-nitrobenzyl alcohol, 6-nitroveratryl alcohol, 2-nitro-4-aminobenzyl alcohol, 2-nitro-4-dimethylaminobenzyl alcohol, 2-nitro-4-methylaminobenzyl alcohol, 2-nitro-5-dimethylaminobenzyl alcohol, 2-nitro-5-aminobenzyl alcohol, 2-nitro-4,6-dimethoxybenzyl alcohol, 2,4-dinitrobenzyl alcohol, 3-methyl-2,4-dinitrobenzyl alcohol, 2-nitro-4-methylbenzyl alcohol, 2,4,6-trinitrobenzyl alcohol, 2-nitrobenzhydrol, 2,2,'-dinitrobenzhydrol, 2,4-dinitrobenzhydrol and 2,2',4,4'-tetranitrobenzhydrol. Similarly suitable are for example 2-nitro-3-hydroxymethylnaphthalene, 1-nitro-2-hydroxymethylnaphthalene, 1-nitro2-hydroxymethylanthraquinone and 2-nitro-3-hydroxymethylpyridine.

As mentioned above, the copolymer according to the invention is based on o-nitrocarbinol esters of olefinically unsaturated carboxylic acids as monomers, examples of usable ethylenically unsaturated monocarboxylic and dicarboxylic acids being acrylic acid, methacrylic acid, maleic acid, dichloromaleic acid, fumaric acid, crotonic acid, itaconic acid and methyleneglutaric acid.

The o-nitrocarbinol esters of olefinically unsaturated carboxylic acids can be prepared by conventional methods of organic chemistry, for example reaction of the acid chlorides with o-nitrocarbinols or by direct acid-catalyzed esterification (cf. eg. DE-A-No. 2,150,691).

Particularly preferred o-nitrocarbinol ester monomers are o-nitrobenzyl acrylate, o-nitrobenzyl methacrylate, o-nitro-α-methylbenzyl (meth)acrylate and 2-nitro-6-chloro-α-methylbenzyl (meth)acrylate.

The copolymer according to the invention contains the o-nitrocarbinol ester monomers (a) in an amount from 5 to 50, preferably from 8 to 30, mol % as copolymerized units.

(b) Suitable for use as copolymerizable olefinically unsaturated silicon-containing organic compounds, the silicon therefore being present in a covalent bond, are for example those which contain substituted aromatic radicals of the general formula (III)

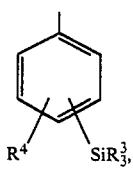 (III)

where $R^3$ and $R^4$ can be identical or different and each is alkyl of 1 to 6 carbon atoms, aryl, such as phenyl, aralkyl of 7 to 10 carbon atoms, for example methylphenyl, but $R^4$ can also be hydrogen, preferably 4-trimethylsilylphenyl, 4-triethylsilylphenyl and 4-tripheynlsilylphenyl radicals; those where the silicon atom is not bonded directly to the aromatic nucleus but via an aliphatic spacer —$(CH_2)x$—, where x can be 1, 2 or 3, or is bonded to the aromatic radical via a hetero atom, for example oxygen or nitrogen, eg. trimethylsilyloxyethylphenyl, bis(trimethylsilyl)aminophenyl, 4-trimethylsilylmethylphenyl and 4-trimethylsilyloxyphenyl radicals; or those having ester groups

where $R^2$ is the silicon-carrying group, preferred $R^2$'s being: trimethylsilyl, trimethylsilylmethyl, 2-(trimethylsilyl)ethyl, 3-(trimethylsilyl)propyl, 3-(pentamethyldisiloxy)propyl, 3-bis(trimethylsiloxy)methylsilylpropyl, 3-tris(trimethylsiloxy)silylpropyl, trimethoxysilylpropyl and trimethoxysilylmethyl.

Examples of preferred olefinically unsaturated compounds (b) containing the abovementioned radicals are: 4-trimethylsilylstyrene, trimethylsilyloxystyrene, t-butyldimethylsilyloxystyrene, trimethylsilyl methacrylate, trimethylsilylmethyl methacrylate, 3-methacryloyloxypropylbis(trimethylsiloxy)methylsilane, 3-methacryloyloxypropylpentamethyldisiloxane, 3-methacryloyloxypropyltris(trimethylsiloxy)silane, 3-methacryloyloxypropyltrimethoxysilane and 2-(trimethylsilyl)ethyl methacrylate.

Component (b) is present in the copolymer of the invention in an amount from 95 to 50, preferably 91 to 55, mol % as copolymerized units.

(c) Suitable copolymerizable olefinically unsaturated carboxylic acids of 3 to 6 carbon atoms are the customary copolymerizable monocarboxylic and dicarboxylic acids, e.g. acrylic acid, methacrylic acid, maleic acid, fumaric acid, crotonic acid, itaconic acid and/or methyleneglutaric acid. Component (c) is preferably methacrylic acid.

These monomers increase the solubility in the aqueous or alkaline developer and thus contribute to shortening the exposure time, since the carboxyl number required for solubility differentiation need not be produced by exclusively photochemical means. In addition, these monomers, by raising the glass transition temperature of the copolymer, help to increase the thermal stability thereof.

Component (c) is present in the copolymer of the invention in an amount from 0 to 20, preferably from 1 to 15, mol % as copolymerized units.

(d) The copolymer according to the invention may also contain, as copolymerized units, further olefinically unsaturated, copolymerizable organic compounds, other than (a), (b) and (c), whose homopolymers are transparent in the wavelength region from 250 to 400 nm. Examples of compounds of this type are: aromatic vinyls, such as styrene and substituted styrenes, ethylene and dienes, $C_1$–$C_8$-alkyl esters of the carboxylic acids mentioned under (c), e.g. butyl methacrylate and methyl methacrylate (methyl methacrylate being preferred), hydroxy-$C_2$–$C_6$-alkyl esters of the carboxylic acids mentioned under (c), and also other derivatives of the carboxylic acids mentioned under (c), e.g. acrylamide, methacrylamide and N-alkyl-substituted derivatives thereof, and also mixtures thereof. By using these monomers it is possible to increase the basic solubility in the developer and the thermal stability of the resist.

The monomers (d) can be present in the copolymer of the invention in amounts from 0 to 25, preferably from 0 to 20, mol % as copolymerized units.

The sum of the percentages mentioned under (a) to (d) is 100. The silicon content of the copolymer according to the invention is >6 percent by weight.

The copolymer according to the invention can be prepared from monomers (a) to (d) in a conventional manner, for example free radical polymerization.

Free radical polymerization is carried out in general by dissolving the monomers in a suitable solvent (for example generethyl acetate, toluene or tetrahydrofuran), freeing the solution from oxygen, adding a polymerization initiator such as azobisisobutyronitrile or benzoyl peroxide, and heating under an inert gas at from 30° to 120° for several hours. As mentioned above, the ratio of silicon-containing monomer (b) to photosensitive o-nitrocarbinol ester monomer (a) and further comonomer (c)+(d) must be such that a silicon content of not less than 6% by weight is obtained in the resulting copolymer. The amount of o-nitrocarbinol ester monomer can vary within the abovementioned limits, depending on the desired properties, but has to be chosen in such a way that, after imagewise exposure, the polymer becomes soluble in aqueous solvents, for example water or aqueous-alkaline solvents, and the ratio of monomer to silicon component produces a silicon content >6% by weight in the polymer. Preference is given to incorporating o-nitrocarbinol ester monomer within the range from 8 to 30 mol %.

The molecular weight of the resulting polymer should advantageously be within the range from 10,000 to 200,000. A narrow molecular weight distribution is particularly favorable. While molecular weights below 10,000 result in undesirably high stripping in the unexposed areas and, in some instances, are not film-forming, molecular weights above 200,000 reduce the solubility in aqueous or aqueous-alkaline solvents and give rise to solution-limiting swelling.

The copolymer according to the invention is suitable in particular for producing a two-layer resist. The two-layer resist producible according to the invention contains a planarizing layer as the lower layer and an upper layer of the copolymer according to the invention which, after imagewise exposure, is strippable in an aqueous or alkaline solvent, the relief structures thus obtained in said copolymer making it possible to transfer the pattern into the planarizing layer by means of oxygen plasma.

The lower, planarizing layer need not be photo-sensitive and advantageously is a commercial cured diazoquinone-novolak resist, polymethyl methacrylate or a polyimide. The thickness of the planarizing layer depends on the height of the steps on the substrate, the combination of substrates produced in semiconductor fabrication with planarizing layer thickness above 1 $\mu$m usually producing a planar surface. A description of the multi-layer technique may be found for example in Introduction to Microlithography, ACS Symp. Ser. 219, L. F. Thompson, C. G. Willson, M. J. Bowden, Eds., American Chemical Soc., Washington DC., 1983 in chapter 6 entitled Multi Layer Resist System.

The thickness of the upper, light-sensitive layer depends on the desired resolution. In general: the thinner the layer, the better the resolution. Resist layers from 0.2 $\mu$m to 1 $\mu$m are usable. The desired layer thickness not only in respect of the lower layer but also in respect of the upper layer is producible using the conventional spincoating technique. The material of the lower layer, for example a solution of a novolak resist, can be spun on by means of the spincoating technique, the thickness of the layer, given constant viscosity, being adjustable by the speed of rotation of the spinner. The resulting layer can then be baked at >160° C. This baked layer must not then be soluble in the solvent for the polymer of the upper layer.

The upper layer is in general likewise applied by spincoating, for which the polymer is advantageously in a concentration from 10 to 30% by weight in, for example, diethylene glycol dimethyl ether and applied in the desired layer thickness at spin speeds from 1,000 to 8,000 revolutions per minute (r.p.m.).

To structure the two-layer resist according to the invention, the upper, photosensitive polymer is subjected to imagewise exposure with DUV light within the wavelength region from 190 nm to 300 nm, preferably 248 nm. The exposure dose is in general within the range from 100 mJ/cm$^2$ to 3,000 mJ/cm$^2$ and must be chosen in such a way that the dose is just sufficient to ensure, in the subsequent development step, that stripping in the exposed areas is complete, so that the planarizing layer underneath is bared. Developing is carried out with water or an aqueousalkaline solvent, such as 0.1% strength sodium hydrogencarbonate solution, 0.2% tetramethylammonium hydroxide, 3% triethanolamine/2% butylglycol and the like. The developer strength is selected to be such that the degree of stripping in the unexposed areas is minimized and does not exceed 10%.

After the upper layer has been given a relief structure pattern, this pattern serves as a mask for transferring the relief structures into the planarizing layer using an oxygen plasma. The oxygen plasma technique is described for example in the abovementioned chapter of Introduction to Microlithography.

In the parallel plate reactor, in general the following conditions are employed: gas pressure from 30 mtorr to 150 mtorr, power of high-frequency generator from 50W to 300 watts, these conditions resulting in etch rates from 500 Å/min to 3,000 Å/min for the planarizing layer. In the similarly suitable barrel reactor (for example the plasma reactor from Technics), typical conditions are 500 watts and a gas pressure of 650 mtorr.

After the mask pattern has been transferred into the planarizing layer, the remaining process steps for fabricating semiconductor devices, such as etching, metallization or doping, can be carried out. The resist is then stripped and fabrication of the desired device completed.

The light-sensitive copolymer according to the invention is particularly advantageously suitable for exposure in the DUV region, since the o-nitrobenzly group has an absorption peak at $\lambda$=258 nm. After exposure it is strippable with water or an aqueous-alkaline solvent and resistant in oxygen plasma. The resist pattern produced is therefore faithfully transferable in an oxygen plasma. The copolymer according to the invention is therefore ideal for use as a light-sensitive material for two-layer resists in the DUV region.

In the Examples which follow, parts and percentages are by weight, unless otherwise stated.

EXAMPLE 1

Preparation of copolymers:

A. 7.1 parts of o-nitro-α-methylbenzyl methacrylate, 42.8 parts of trimethylsilyl methacrylate (from Petrarch Systems) and 7.5 parts of methacrylic acid are dissolved in 125 parts of ethyl acetate, the solution is refluxed for 1 hour under nitrogen, 0.064 part of azobisisobutyronitrile is added, and a temperature of about 80° C. is maintained for a further 8 hours. After cooling down, the polymer is precipitated in about 2,000 parts of naphtha. The polymer is filtered off with suction and dried under reduced pressure. Analysis indicates an o-nitro-α-methylbenzyl methacrylate content of 13.4 mol % and a silicon content of 6.7%.

B. 9.4 parts of o-nitro-α-methylbenzyl methacrylate and 20 parts of trimethylsilyl methacrylate are dissolved in 20 parts of toluene. After this solution has been heated under nitrogen for one hour, 0.195 part of benzoyl peroxide is added to start 8 hours of polymerization at 80° C. Analysis of the polymer reveals a silicon content of 8.4%.

C. The polymerization is carried out as in Example 1 A, except that the monomers used are 2.35 parts of o-nitro-α-methylbenzyl methacrylate, 1.72 parts of methacrylic acid and 29.5 parts of 3-methacryloxypropyltris(trimethylsiloxy)silane. Analysis reveals a silicon content of 21.1%.

D. (Comparison) Polymerization and monomers are used as in Example 1 C, except that the amount of 3-methacryloxypropyltris(trimethylsiloxy)silane used is reduced to 6.0 parts. Elemental analysis indicates a silicon content of 4.3%.

E. (Comparison) As comparison for the determination of the oxygen plasma resistance, a copolymer is prepared from 2.8 parts of o-nitro-α-methylbenzyl methacrylate, 2.4 parts of methacrylic acid, 9.5 parts of methyl methacrylate and 1.95 parts of hydroxyethyl methacrylate.

EXAMPLE 2

A 20% solution in diethylene glycol dimethyl ether of the polymer prepared in Example 1 A is passed through a filter (pore diameter about 0.2 μm) and spuncoated at 1,450 r.p.m. onto an oxidized silicon wafer. After baking at 160° C. for 30 minutes the resulting layer thickness is about 1.0 μm. After exposure with an excimer laser (λ=248 nm, KrF) the exposed areas can be washed out with pure water if the exposure energy is not less than 2,500 mJ/cm².

EXAMPLE 3

Substantially 1 μm thick layers of the polymers of Examples 1 A-E and commercial products, such as polymethyl methacrylate (=PMMA) and a novolak positive resist, are spuncoated onto SiO₂ wafers, and dried at 120° C. for 10 minutes, and etched in a barrel reactor with pure oxygen plasma. The reactor conditions employed are 500W power and an oxygen pressure of 650 mtorr. The etch rates are shown in Table I.

TABLE I

| Polymer | Silicon content % | Etch rate [Å/min] |
|---|---|---|
| PMMA | 0 | 1700 |
| 1 E (comparison) | 0 | 1500 |
| Novolak positive resist | 0 | 610 |
| 1 D | 4.3 | 840 |
| 1 A | 6.7 | 150 |
| 1 B | 8.4 | 120 |
| 1 C | 21.1 | 42 |

EXAMPLE 4

The different etch rates of a silicon-containing polymer (1 B), of a non-silicon-containing o-nitrobenzyl methacrylate polymer as comparative system (1 E) and of the polymers for the planarizing layer to be structured are shown in Table II. Each polymer is applied to oxidized silicon wafers in substantially 1 μm thick layers. The polymers of Example 1 B, which contains silicon, and Example 1 E, as comparative system, are baked at 120° C. for 10 minutes, polyimide is baked at 200° C. for 30 minutes, a commercial novolak positive resist at 140° C. for 30 minutes and PMMA at 160° C. for 30 minutes. The coated wafers are placed on the lower electrode of a parallel plate reactor from Plasma-Technology and etched under various oxygen pressures to determine the etch rates of the photosensitive top layer (1 B) and of the planarizing layers.

TABLE II

| | Etch rate of polymers in oxygen plasma (100 W) | | | |
|---|---|---|---|---|
| | Etch rate [Å/min] under different oxygen pressures | | | |
| Polymer | 30 mtorr | 50 mtorr | 100 mtorr | 150 mtorr |
| PMMA | 1810 | 2150 | 2770 | 2770 |
| 1 E | 1810 | 2120 | 2600 | 2850 |
| Novolak positive resist | 1000 | 1300 | 1470 | 1670 |
| Polyimide | 560 | 640 | 750 | 870 |
| 1 B | 53 | 70 | 51 | 104 |

EXAMPLE 5

Oxidized silicon wafers are coated with various thicknesses of the polymer prepared as in Example 1 C by spinning 10% strength and 15% strength solutions in diethylene glycol dimethyl ether at various speeds of the spincoater to produce layer thickness from about 0.3 μm to 1 μm. The wafers are then etched in oxygen plasma in a parallel plate reactor for sufficiently long under conditions under which a typical 2 μm planarizing layer, for example a novolak positive resist, is completely stripped. Starting layer thickness and thickness after etching are measured with an α-step profilometer. The results are shown in Table III. The reactor is operated under the following conditions: oxygen pressure 100 mtorr, power 100 watts.

TABLE III

| Layer thickness of resist as per Example 1 C as a function of etching time in oxygen plasma (100 mtorr, 100 W) | | | | |
|---|---|---|---|---|
| | | Layer thickness in [μm] | | |
| Concentration | r.p.m. | before | after 6 minutes' etching | after 15 minutes' etching |
| 15 | 2000 | 1.08 | 0.93 | 0.91 |
| 15 | 6000 | 0.80 | 0.65 | 0.64 |
| 15 | 6000 | 0.80 | 0.66 | 0.64 |

TABLE III-continued

Layer thickness of resist as per Example 1 C as a function of etching time in oxygen plasma (100 mtorr, 100 W)

| Concentration | r.p.m. | Layer thickness in [μm] | | |
|---|---|---|---|---|
| | | before | after 6 minutes' etching | after 15 minutes' etching |
| 10 | 1000 | 0.61 | 0.30 | 0.09 |
| 10 | 2500 | 0.39 | 0.10 | 0.09 |
| 10 | 5000 | 0.32 | 0.08 | 0.07 |

EXAMPLE 6

A 20% strength solution of the polymer prepared as described in Example 1 C, in cyclopentanone, is spun-coated at 5,000 r.p.m. onto an oxidized silicon wafer, the resulting layer thickness being 1.34 μm. The coated wafer is then baked at 120° C. on a hot plate for 2 minutes and thereafter exposed using an excimer laser giving monochromatic light ($\lambda=248$ nm, KrF). A chromium-coated quartz plate having areas differing in transmittance is used as a contact mask. The stepped mask causes exposure in different areas with increasing amounts of light. The minimum dose required for detaching the entire film in the exposed areas is defined as the sensitivity (Table IV).

TABLE IV

Development of resist from Example 1 C in various aqueous-alkaline developers

| Developer: Base and organic components (content) | Exposure time (sec) | Development time (sec) | pH | Sensitivity (mJ/cm²) |
|---|---|---|---|---|
| Triethanolamine (3%), Butylglycol (2%) | >50 | 60 | 10.3 | >1750 |
| Triethanolamine (4%), Isopropanol (10%), Acetylacetone (5%) | 30 | 60 | 8.1 | 1050 |
| Tetramethylammonium hydroxide (0.2%) | 15 | 30 | 12.6 | 500 |

EXAMPLE 7

An oxidized silicon wafer is coated with a 1 μm thick layer of a commercial novolak-based positive resist and baked at 180° C. for 30 minutes. A solution of the polymer prepared in Example 1 A is prepared and applied at 3,000 r.p.m. to the substrate coated with the commercial novolak positive resist. The substrate is then baked at 120° C. for 10 minutes and exposed to light from an excimer laser at $\lambda=248$ nm through a quartz mask coated with chromium structures. The exposed areas are dissolved away with water. The wafer is then placed on the lower electrode of a parallel plate reactor and treated for 10 minutes in an oxygen plasma under an oxygen partial pressure of 50 mtorr. In the course of this treatment, the lower, planarizing layer is completely stripped in the exposed areas.

We claim:

1. A copolymer containing as copolymerized units
   (a) from 5 to 50 mol % of one or more compounds of the general formula (I)

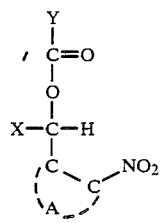

where A is an aromatic or hetaromatic, substituted or unsubstituted ring system of 5 to 14 ring members, X is hydrogen, alkyl of 1 to 8 carbon atoms or substituted or unsubstituted aryl or aralkyl, and Y is an ethylenically unsaturated radical of 2 to 6 carbon atoms,
   (b) from 95 to 50 mol % of one or more copolymerizable olefinically unsaturated silicon-containing organic compounds,
   (c) from 0 to 20 mol % of one or more copolymerizable olefinically unsaturated carboxylic acids of 3 to 6 carbon atoms,
   (d) from 0 to 25 mol % of one or more further olefinically unsaturated, copolymerizable organic compounds other than (a), (b) and (c), whose homopolymers are transparent within the wavelength region from 250 to 400 nm, with the proviso that the sum of the percentages mentioned under (a) to (d) is 100 and the copolymer has a silicon content of >6% by weight.

2. A copolymer as claimed in claim 1, wherein the radical Y in the general formula (I) is one of the radicals

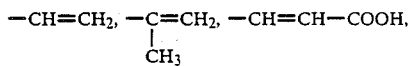

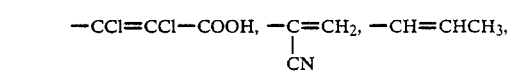

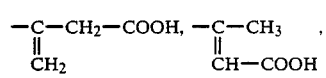

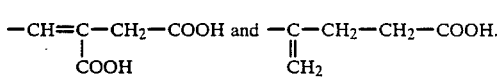

3. A copolymer as claimed in claim 1, wherein, in the general formula (I), A is phenyl, X is methyl and Y is a

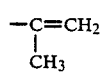

group.

4. A copolymer as claimed in claim 1, wherein the parent carbinol to the o-nitrocarbinol ester group of the formula (I) is o-nitrobenzyl alcohol, nitro- 6-chlorobenzyl alcohol, 2-nitro-4-cyanobenzyl alcohol, α-methyl-o-nitrobenzyl alcohol, α-phenyl-o-nitrobenzyl alcohol or α-(o-nitrophenyl)-o-nitrobenzyl alcohol.

5. A copolymer as claimed in claim 1, wherein the o-nitrocarbinol ester of the general formula (I) is an ester of acrylic acid, of methacrylic acid, of maleic acid, of fumaric acid or of crotonic acid.

6. A copolymer as claimed in claim 1, wherein the copolymerizable olefinically unsaturated silicon-containing compound (b) is a derivative or styrene or α-methylstyrene.

7. A copolymer as claimed in claim 6, wherein the copolymerizable olefinically unsaturated silicon-containing compound (b) is 4-trimethylsilylstyrene.

8. A copolymer as claimed in claim 1, wherein the copolymerizable olefinically unsaturated silicon-containing compound (b) is a derivative of acrylic or methacrylic acid.

9. A copolymer as claimed in claim 8, wherein the copolymerizable olefinically unsaturated silicon-containing compound (b) comprises one or more silicon-containing monomers selected from the group consisting of trimethylsilyl methacrylate, trimethylsilylmethyl methacrylate, 3-methacryloyloxypropylbis(trimethylsiloxy)methylsilane, 3-methacryloyloxypropylpentamethyldisiloxane, 3-methacryloyloxypropyltris(trimethylsiloxy)silane, 3-methacryloyloxypropyltrimethoxysilane and 2-(trimethylsilyl)ethyl methacrylate.

10. A copolymer as claimed in claim 1, which contains as component (c) acrylic or methacrylic acid as copolymerized units.

11. A copolymer as claimed in claim 1, which contains as component (d) an ester of acrylic or methacrylic acid with a monoalkanol of 1 to 8 carbon atoms and/or a hydroxyalkyl (meth)acrylate as copolymerized units.

12. A process for preparing a copolymer as claimed in claim 1, which comprises polymerizing the compounds mentioned under (a) to (d) in the presence of a free radical initiator.

13. A process for producing a two-layer resist, which comprises using as the lower layer a polymer which is degradable in oxygen plasma and as the upper layer a copolymer as claimed in claim 1.

14. A process for producing a two-layer resist as claimed in claim 13, wherein the copolymer as claimed in claim 1 is structured and the pattern is transferred into the lower layer by means of a plasma.

15. A process as claimed in claim 14, wherein the plasma used is an oxygen plasma.

16. A process for fabricating a semiconductor device by applying a light-sensitive material to a substrate, subjecting said light-sensitive material to imagewise exposure, aqueous alkaline development and further development by means of a plasma, and completing fabrication of the semiconductor device in a conventional manner, which comprises using as the light-sensitive material a copolymer as claimed in claim 1.

* * * * *